(12) United States Patent
Bito et al.

(10) Patent No.: US 12,080,633 B2
(45) Date of Patent: Sep. 3, 2024

(54) CUSTOM LEADFRAME FROM STANDARD PLUS PRINTED LEADFRAME PORTION

(71) Applicant: Texas Instruments Incorporated, Dallas, TX (US)

(72) Inventors: Jo Bito, Dallas, TX (US); Benjamin Stassen Cook, Addison, TX (US); Steven Kummerl, Carrollton, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 187 days.

(21) Appl. No.: 16/123,100

(22) Filed: Sep. 6, 2018

(65) Prior Publication Data

US 2020/0083147 A1 Mar. 12, 2020

(51) Int. Cl.
*H01L 23/495* (2006.01)
*H01L 23/498* (2006.01)

(52) U.S. Cl.
CPC .... *H01L 23/49541* (2013.01); *H01L 23/4951* (2013.01); *H01L 23/49537* (2013.01); *H01L 23/49816* (2013.01)

(58) Field of Classification Search
CPC ............ H01L 23/142; H01L 23/49558; H01L 23/49537; H01L 23/495; H01L 23/49527; H01L 23/49541; H01L 23/49565; H01L 21/563; H01L 23/4821; H01L 23/4867; H01L 23/49582; G06F 30/33; G06F 30/308; G06F 30/347; G06F 30/367; G06F 30/39
See application file for complete search history.

(56) References Cited

U.S. PATENT DOCUMENTS

| | | | |
|---|---|---|---|
| 6,825,551 B1* | 11/2004 | Do Bento Vieira | H01L 23/3107 257/666 |
| 7,102,210 B2* | 9/2006 | Ichikawa | H01L 23/49548 257/666 |
| 9,780,017 B2 | 10/2017 | Cook et al. | |
| 9,805,955 B1* | 10/2017 | Sirinorakul | H01L 23/49503 |
| 2007/0108585 A1* | 5/2007 | Pavier | H01L 23/3736 257/690 |
| 2009/0315163 A1* | 12/2009 | Johnson | H01L 23/3107 257/676 |
| 2012/0193772 A1* | 8/2012 | Jiang | H01L 23/49562 257/666 |
| 2016/0358886 A1* | 12/2016 | Meyer-Berg | H01L 23/44 |
| 2017/0309549 A1* | 10/2017 | Wachtler | H01L 23/49541 |

\* cited by examiner

*Primary Examiner* — Sarah K Salerno
(74) *Attorney, Agent, or Firm* — Ronald O. Neerings; Frank D. Cimino

(57) ABSTRACT

A packaged semiconductor device includes an IC die having bump features that are coupled to bond pads flip chip attached to a custom LF. The custom LF includes metal structures including metal leads on at least 2 sides, and printed metal providing a printed LF portion including printed metal traces that connect to and extend inward from at least one of the metal leads over the dielectric support material that are coupled to FC pads configured for receiving the bump features including at least some of the printed metal traces coupled to the bond pads on the IC die. The IC die is flip chip mounted on the printed LF portion so that the bump features are connected to the FC pads.

32 Claims, 4 Drawing Sheets

CUSTOM LEADFRAME FROM STANDARD PLUS PRINTED LEADFRAME PORTION

FIELD

This Disclosure relates to leadframe packaging of semiconductor devices and resulting packaged semiconductor devices.

BACKGROUND

A variety of semiconductor chip packages are known that provide support for an integrated circuit (IC) chip or die and associated bond wires, provide protection from the environment, and enable surface mounting of the die to and interconnection with a printed circuit board (PCB). One conventional package configuration includes a leadframe (LF) having leads on at least 2 sides of a die pad.

LF packages are well known and widely used in the electronics industry to house, mount, and interconnect a variety of ICs. A conventional LF strip is typically die-stamped from a sheet of flat-stock metal (e.g., copper), and includes a plurality of metal leads temporarily held together in a planar arrangement about a central region during package manufacture by a rectangular frame comprising a plurality of expendable "dam-bars." A die pad may be provided for a semiconductor die supported in the central region by "tie-bars" that attach to the frame. The leads extend from a first end integral with the frame to an opposite second end adjacent to, but spaced apart from, the die pad.

Different packaged devices, mechanical stress, heat dissipation, mold locking features, and electrical parasitic components generally require a custom LF design. A LF is generally designed in a co-design process together with the IC die including mechanical, thermal, electrical modeling, which is time consuming and results in a high LF design cost. A change in a target specification can cause another iteration of the co-design process, including a change in the bump layout on the IC die and/or a change in the LF design.

SUMMARY

This Summary is provided to introduce a brief selection of disclosed concepts in a simplified form that are further described below in the Detailed Description including the drawings provided. This Summary is not intended to limit the claimed subject matter's scope.

This Disclosure recognizes one can avoid the conventional requirement for a custom LF design for each new IC die design which typically results in a high development cost by using a standard LF and IC bump design, enabled by an additive manufactured metal process that adds printed LF traces that are coupled to leads of a standard LF. The printed LF portions are physically supported by a dielectric support material in the gaps between the metal structures of the standard LF, and include connections to leads of the standard LF to provide a custom LF design that provides routing between the leads of the standard LF and each bump feature (e.g., a solder bump or a solder capped copper pillar) on the IC die. This Disclosure enables quickly generating a new custom LF design digitally and then fabricating the actual custom LF. Also, this Disclosure enables standardizing the bump design for ICs which can reduce the number of die masks needed, such as by avoiding the need for redirect layers.

Disclosed aspects include a packaged semiconductor device comprising an IC die having bump features that are coupled to bond pads that are flip chip (FC) attached to a custom LF. The custom LF includes metal structures including metal leads on at least 2 sides, and printed metal providing a printed LF portion including printed metal traces that connect to and extend inward from at least one of the metal leads over the dielectric support material that are coupled to FC pads configured for receiving the bump features, including at least some of the printed metal traces coupled to the bond pads on the IC die. The IC die is flip chip mounted on the printed LF portion so that the bump features are connected to the FC pads.

BRIEF DESCRIPTION OF THE DRAWINGS

Reference will now be made to the accompanying drawings, which are not necessarily drawn to scale, wherein.

DETAILED DESCRIPTION

Figure 1:
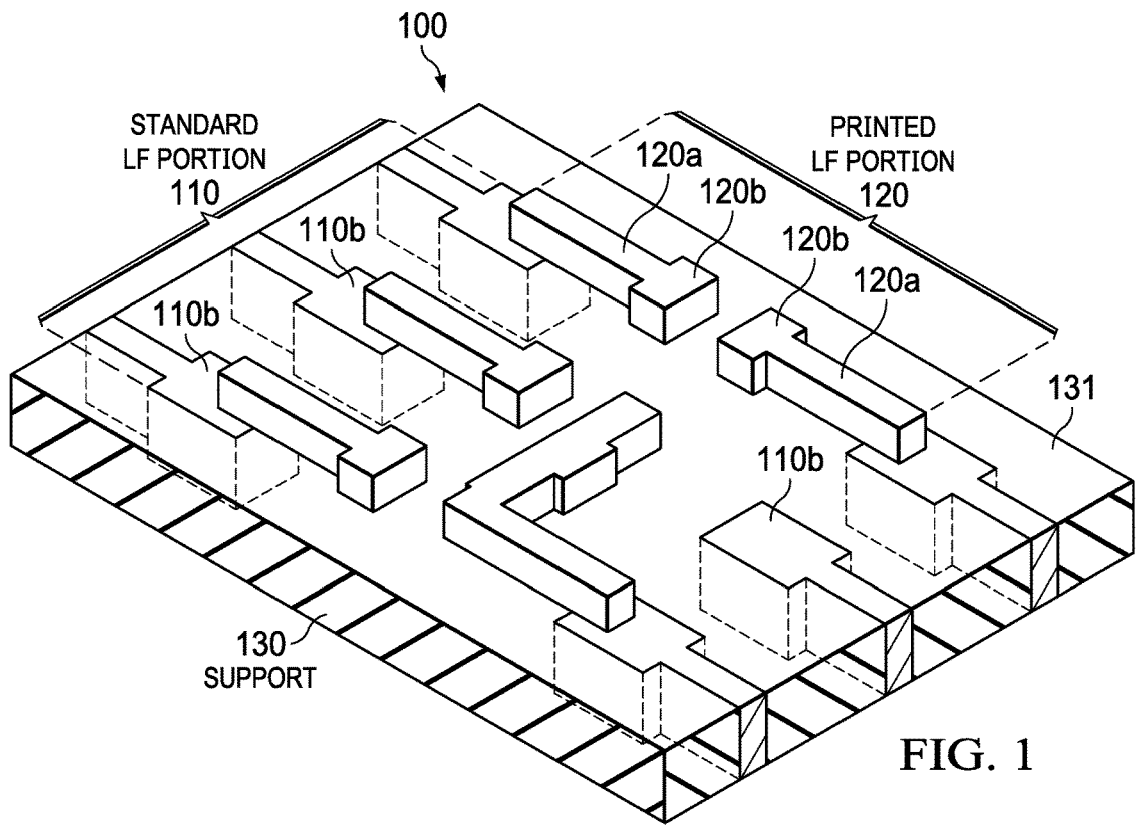
FIG. 1 shows a simplified example custom LF showing its standard LF portion and printed LF portion coupled to the standard LF portion, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

FIG. 1 shows a simplified example custom LF 100 showing its standard LF portion 110 with leads 110b on at least 2 sides and a printed LF portion 120 coupled to the leads 110b of the standard LF portion 110, according to an example embodiment. There is generally some designed overlap between the traces 120a of the printed LF portion 120 and the leads 110b to reflecting manufacturing tolerances for ensuring a connection is reliably provided. The custom LF 100 is generally part of a custom LF strip that includes a plurality of LFs. The printed metal may have a porosity of greater than 10%.

The custom LF 100 includes a dielectric support surface 131 in the gaps between the metal structures of the standard LF portion 110 that provides mechanical support beyond the area of the standard LF for the printed LF portion 120. The dielectric support surface 131 can be provided as the surface of a support 130 which generally comprises a pre-molded structure with the leads 110b being embedded leads having an exposed top surface so that there is dielectric material between adjacent ones of the leads 110b. The pre-molded structure can comprise a pre-molded standard LF that provides the standard LF portion 110 where the mold compound provides the dielectric support surface 131 and the leads 110b are exposed, or by a single level or a multi-level molded interconnect substrate (MIS) that comprises a pre-molded structure including an MIS leadframe providing the standard LF portion 110, where the top dielectric layer of the MIS is used as the dielectric support surface 131 and the leads 110b are exposed. The standard LF portion 110 can also be provided or processed to have a nano-roughened surface to improve adhesion of the traces 120a of the printed LF portion 120 to the leads 110b.

The printed LF portion 120 is formed by additively depositing (e.g., 3D printing, i.e., inkjet printing, or screen printing) a metal precursor (e.g., an ink or a paste including a plurality of metal particles) to generally deposit a printed metal precursor. The additively depositing is generally followed by sintering or curing to form the printed LF portion 120 including FC pads 120b and metal traces 120a that connect to and extend inward from at least one of the metal leads 110b over the dielectric support surface 131. A typical thickness for the printed metal precursor is 75 µm to 150 µm. The additively depositing process can comprise a plurality of coating and sintering steps, such as a sequence of powder coating followed by laser exposure.

For some devices some traces 120a may extend from one side of the custom LF 100 without any FC bond pad 120b in the path, such as to provide common ground or a thermal dissipation path. The IC die is then FC coupled to FC pads 120b that are configured for receiving bump features that are coupled to bond pads on an IC die to be mounted. Sintering or curing of the metal precursor is generally performed before FC mounting. The FC pads 120b are positioned for FC mounting the IC die on the printed metal so that the bump features (see bump feature 140a in FIG. 2C described below) land on the FC pads 120b. After FC mounting the IC die the LF strip is generally heated in a conventional solder reflow process to a temperature above the melting point of the solder material used, which may improve the electrical conductivity of the printed LF portion 120.

As known in the art of printing, an ink includes a material that is either solid (e.g., particles, such as nanoparticles) or a precursor for a solid that forms a solid (e.g., particles) upon curing or sintering to remove its liquid carrier including a solvent and/or a dispersant. For example, the ink can be a sinterable metal ink or an ultraviolet (UV)-curable polymer or a UV-curable polymer-based mixture. The ink is additively depositable by a printer platform into its programmed desired locations. The ink deposition apparatus can be an inkjet printer that uses piezoelectric, thermal, or acoustics, an electrostatic inkjet printer, or a screen or flexographic printer.

A metal paste, such as after being additively deposited by screen printing, can be processed including a heat up step in a reducing gas atmosphere and then a vacuum sintering step generally at a temperature of at least 200° C. for forming a sintered metal coating. Metal pastes can be conventionally sintered in a cure oven to remove the binder and solvent if present, and to densify for reducing the porosity the metal material.

Figure 2A:
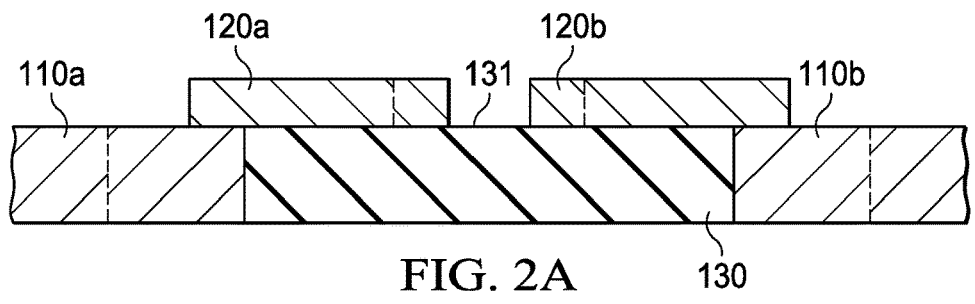
FIGS. 2A-F show views at various stages of assembling a disclosed packaged semiconductor device including a disclosed custom leadframe that comprises a standard LF portion and a printed LF portion.
Figure 2C:
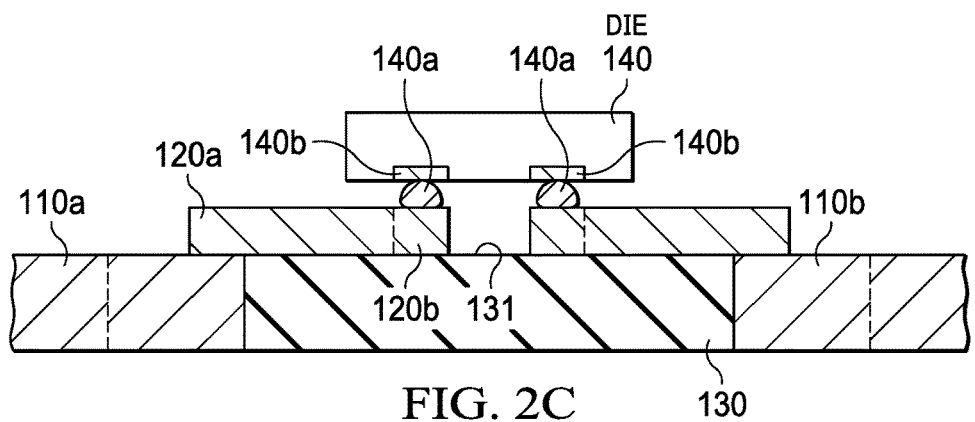
Figure 2B:
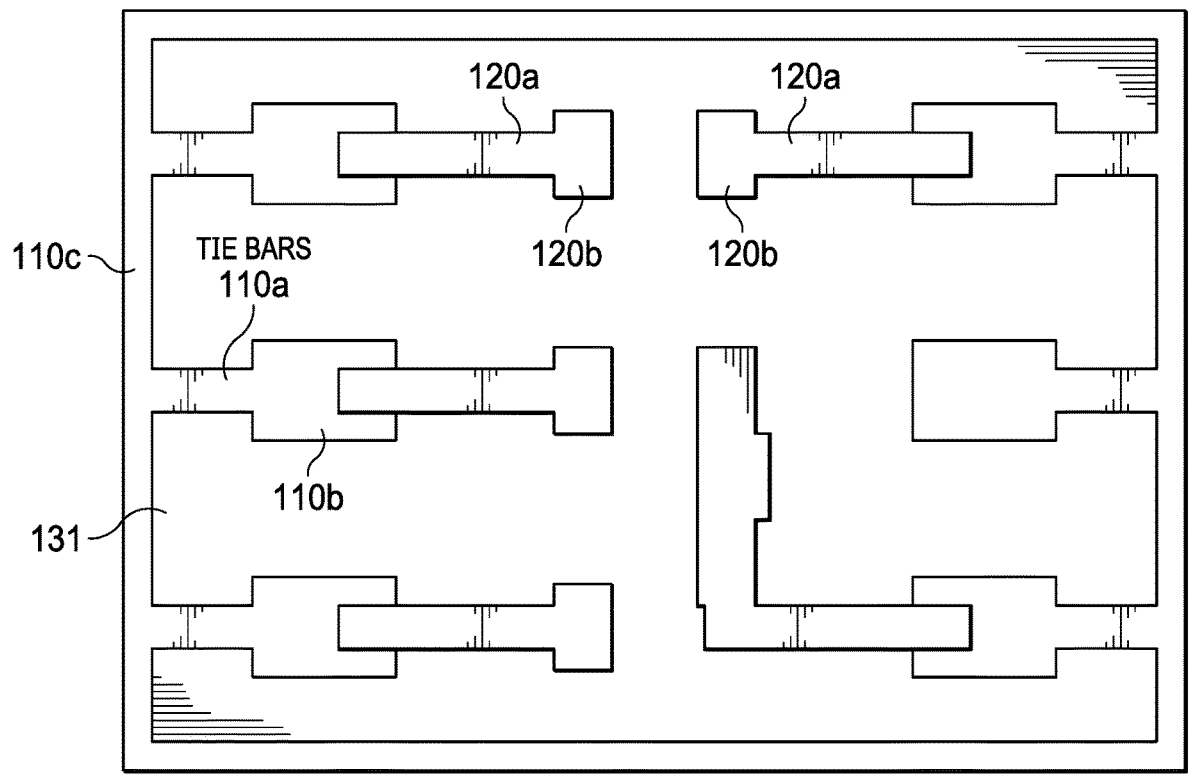
Figure 2D:
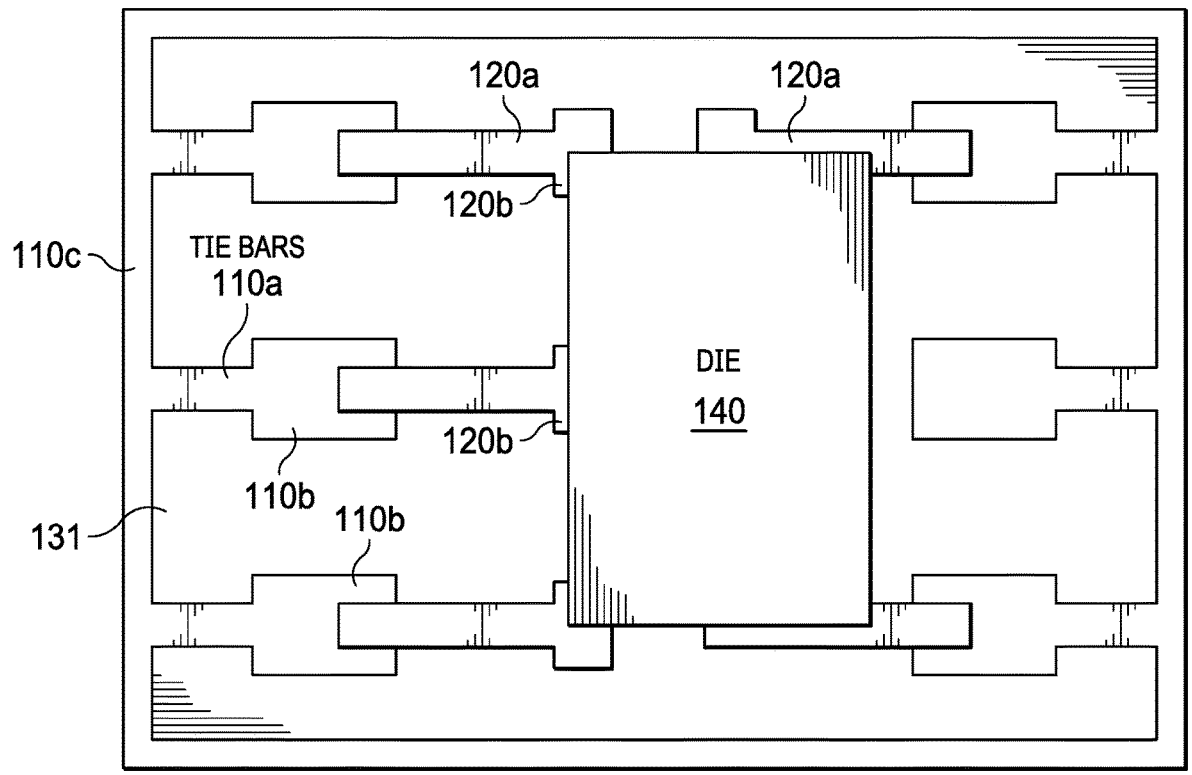

FIGS. 2A-F show views at various stages of assembling a packaged semiconductor device including a disclosed custom leadframe that includes a standard LF portion and a printed LF portion. FIG. 2A shows a side view and FIG. 2B a top view of a standard LF portion shown by its leads 110b and tie bars 110a after additively depositing a printed LF portion shown by its metal traces 120a and FC pads 120b that are supported by a dielectric support surface 131 that is in the gaps between the metal structures of the standard LF portion. The tie bars 110a secure the metal leads 110b to the frame 110c. FIG. 2C shows a side view and FIG. 2D a top view of a standard LF shown by its leads 110b and tie bars 110a after the FC mounting of an IC die 140 having bond pads 140b with bump features 140a thereon that are on the printed LF portion so that the IC die's bump features 140a land on the FC pads 120b of the printed LF portion.

Figure 2E:
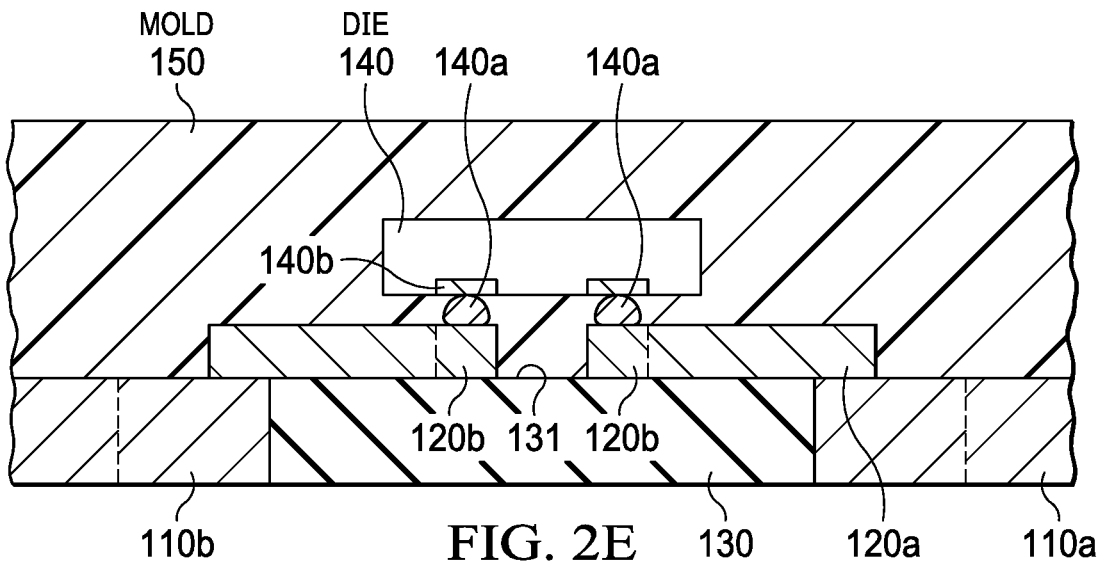
Figure 2F:
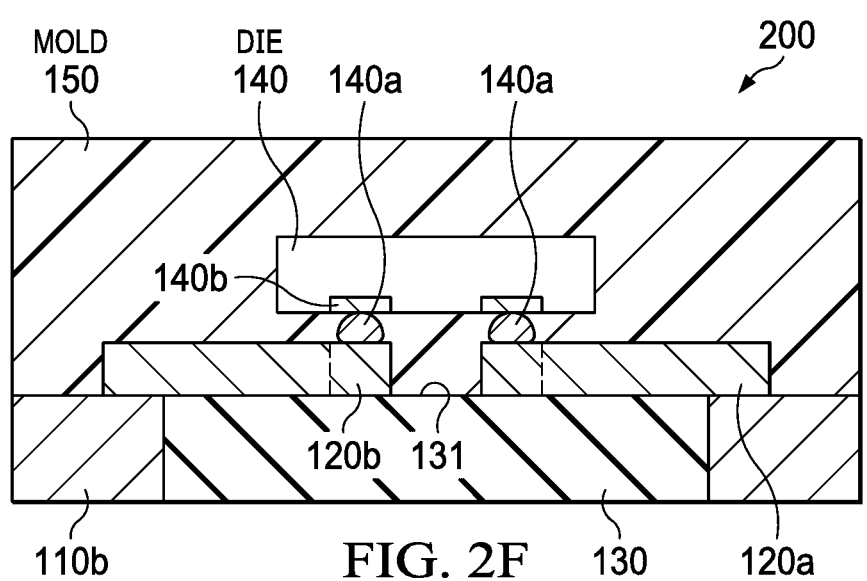

FIG. 2E shows a side view after molding to form a molding material 150 around the LF sheet. FIG. 2F shows a side view after singulation of the molded LF sheet to form the packaged semiconductor device 200 shown.

Figure 3A:
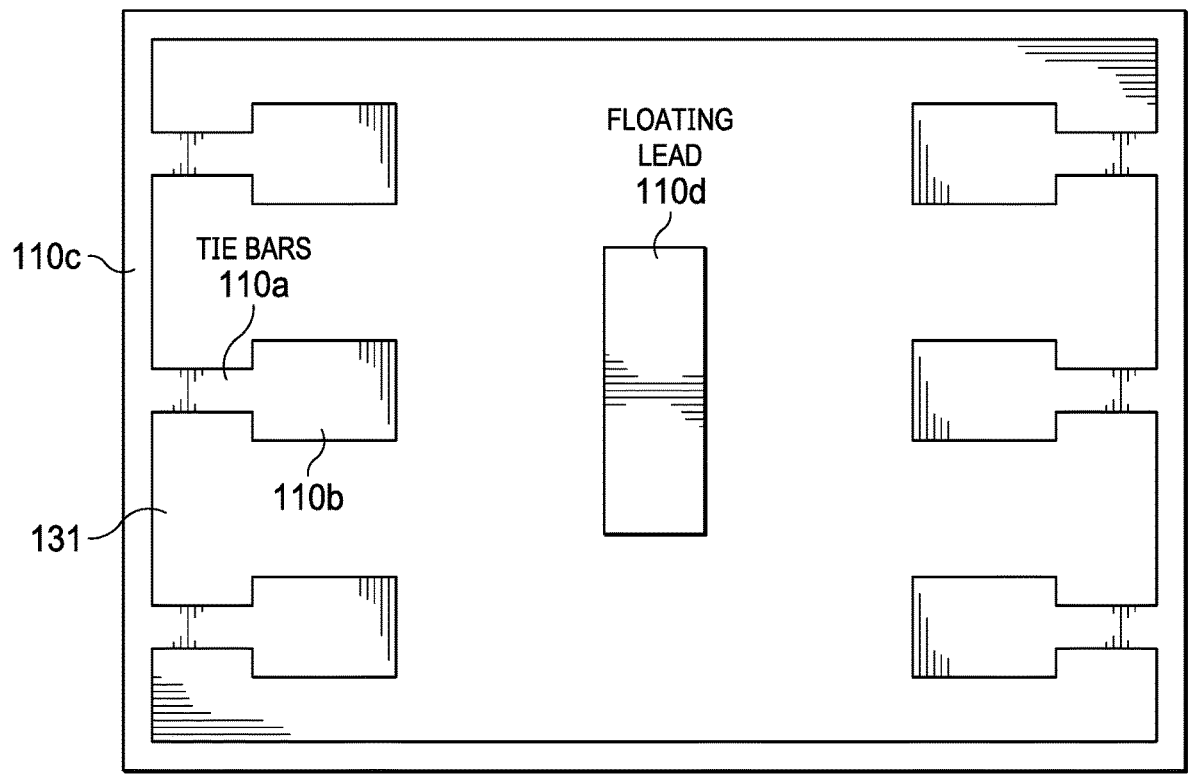
FIG. 3A shows a top view of a standard LF portion with floating leads, and FIG. 3B the standard LF portion in FIG. 3A after printing a printed LF portion that contacts other leads of the standard LF.
Figure 3B:
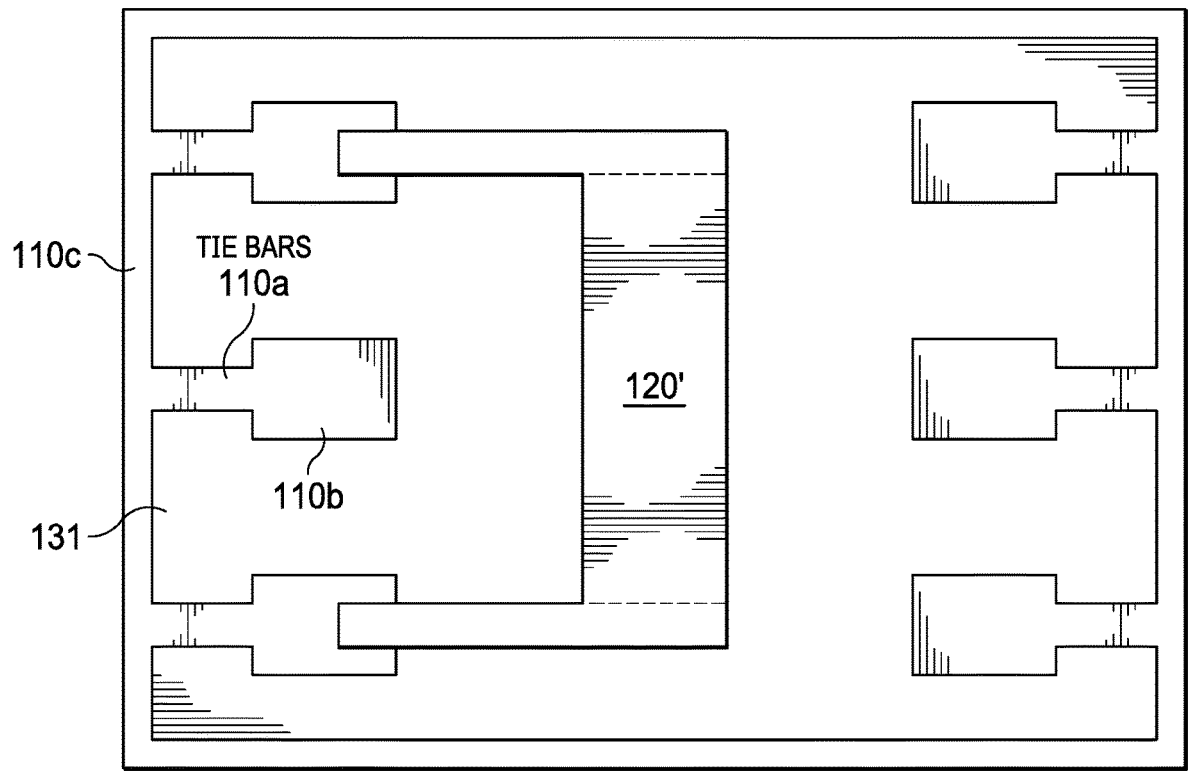

FIG. 3A shows a top view of a standard LF portion with a floating lead 110d, and FIG. 3B shows the standard LF portion in FIG. 3A after printing a printed LF portion 120' that contacts other leads of the standard LF. Floating leads can add more flexibility in the IC package input/output (I/O) configuration and thermal dissipation by providing an exposed pad on the back side of the package near in the middle of the IC, as well as mechanical stress mitigation. A floating lead design is a standard feature in some commercially available existing packages, such as the HOTROD™ package from Texas Instruments Incorporated used for various power converter devices.

A method of forming a disclosed custom LF can first determine a plurality of preliminary candidate LF designs which also satisfy device requirements for the IC die including the number of I/Os, voltage and/or current rating, and the mechanical and/or thermal stress. The preliminary candidate LFs can be narrowed in number to identify candidate LFs by simulating the preliminary candidate LFs to quantify their device performance. This narrowing process creates a set of candidate LF designs which satisfies all requirements for one particular IC device. The same process is repeated for other IC devices which have different voltage and/or current ratings, and mechanical and/or thermal stress, but some similarity in the number of I/Os and the package size. This process step creates a set of candidate custom LF designs for different IC devices which have a similar number of I/Os and die size.

One or more standard LFs will generally be designed based on common features two or more candidate LFs have. An algorithm can identify the common features among the candidate custom LF designs, which together determine the standard LF design. The standard design LF is then fabricated as a LF strip using conventional LF manufacturing technology. 3D printing technology is then used to fabricate the printed metal portions including printed traces that extend to contact on top of the edge of standard LF traces to reproduce the candidate LF designs. In this way, a standard LF design can be used for candidate LF designs for different devices.

There can be more than one standard LF design depending on how to categorize candidate LF designs. The candidate LF design can be categorized based on the similarity, such as the number of I/Os, package size, thermal dissipation performance, and mechanical strength.

As noted above the surface of the LFs 110 can include nano-roughening. Next, a metal precursor material is additively deposited and is then sintered or cured (e.g., laser processed) to provide metal traces and FC pads, and to connect the metal traces to leads of standard LFs for desired routing and for satisfying the other LF properties such as the number of I/O pins, thermal dissipation, and mechanical stress. The additively depositing can comprise inkjet printing using piezoelectric, thermal, or acoustics, or electrostatic inkjet printing, screen printing, or flexographic printing. Molding and singulating of the LF strip generally follows.

The printed metal precursor material can comprise an ink comprising a material that is a solid or a precursor for a solid that forms a solid upon the curing or the sintering. The ink includes copper or silver nanoparticles. The printed metal generally has a porosity greater than, a mechanical strength less than, and an electrical conductivity less than that of the metal of the LFs.

There are several standard LF options that can be used with disclosed aspects. Two or more standard LFs may be combined, such as a top leadframe on a bottom leadframe. Some of the leads of the standard LF may also be floating as shown in FIGS. 3A and 3B described above that can add more flexibility in IC package I/O configuration, such as to thermal dissipation, and/or to provide mechanical stress mitigation.

Advantages provided by disclosed custom LFs include reducing the time and the cost of LF orders, standardizing the LF design and IC bump design to reduce the number of mask required. Moreover, additive manufacturing of metal layers allows a flexible design and fabrication of LFs.

Disclosed embodiments can be integrated into a variety of assembly flows to form a variety of different semiconductor integrated circuit (IC) devices and related products. The assembly can comprise single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many other embodiments and variations of embodiments are possible within the scope of the claimed invention, and further additions, deletions, substitutions and modifications may be made to the described embodiments without departing from the scope of this Disclosure.

The invention claimed is:

1. A semiconductor packaging method, comprising:
providing a metal leadframe (LF) strip including a plurality of LFs that each include metal structures including metal leads on at least 2 sides and a dielectric support material in gaps between the metal structures;
additively depositing a printed metal precursor material on at least a portion of the metal leads followed by sintering or curing to form printed metal to provide a printed LF portion including printed metal traces that connect to and extend inward from at least one of the metal leads over the dielectric support material; and
flip chip mounting an integrated circuit die on the printed LF portion.

2. The method of claim 1, wherein the printed metal precursor material comprises an ink comprising a material that is a solid or a precursor for a solid that forms a solid upon the curing or the sintering.

3. The method of claim 2, wherein the ink includes copper or silver nanoparticles.

4. The method of claim 1, wherein the printed metal has a porosity greater than, a mechanical strength less than, and an electrical conductivity less than the metal structures of the LFs.

5. The method of claim 1, further comprising molding then singulating the LF strip.

6. The method of claim 1, wherein the dielectric support material is provided by a top dielectric layer of a molded interconnect substrate (MIS).

7. The method of claim 1, wherein the additively depositing comprises inkjet printing using piezoelectric, thermal, acoustic, or electrostatic inkjet printing, screen printing, or flexographic printing.

8. The method of claim 1, wherein a surface of the LFs include nano-roughening.

9. The method of claim 1, wherein the metal structures further comprise at least one floating lead, and wherein the printed LF portion contacts the floating lead.

10. The method of claim 1, wherein the printed metal has a porosity of greater than 10%.

11. The method of claim 1, wherein at least some of the metal leads have a first end extending away from a center of the lead frame and a second end extending toward the center of the lead frame and wherein each printed metal trace has a first end deposited on the second end of one of the metal leads.

12. The method of claim 11, wherein each printed metal trace extends from the second end of one of the metal leads and toward the center of the lead frame.

13. A semiconductor packaging method, comprising:
providing a metal leadframe (LF) strip including a plurality of LFs that each include metal structures including metal leads on at least 2 sides and a dielectric support material in gaps between the metal structures;
additively depositing a printed metal precursor material followed by sintering or curing to form printed metal to provide a printed LF portion including printed metal traces that connect to and extend inward from at least one of the metal leads over the dielectric support material that are coupled to flip chip (FC) pads configured for receiving bump features including at least some of the printed metal traces coupled to bond pads on an integrated circuit (IC) die to be mounted;
flip chip mounting the IC die on the printed LF portion so that the bump features are connected to the FC pads; and
determining a plurality of preliminary candidate LF designs which satisfy requirements for the IC die including a number of input or outputs (I/Os) and a location of the bump features, narrowing the preliminary candidate LFs in number to identify candidate LFs by simulating the preliminary candidate LFs to quantify their performance to create a set of candidate LF designs which satisfy requirements for the IC die, repeating the determining and narrowing for at least one other IC die that has some similarity in the number of I/Os and a package size, creating a set of candidate custom LF designs for different IC devices including the IC die and the other IC die which have a similar number of the I/Os and die size, and generating a custom LF design including the LF and printed LF portion based on common features between two or more of the candidate custom LF designs.

14. A semiconductor packaging method, comprising:
providing a metal leadframe (LF) including metal leads on at least 2 sides and a dielectric support material in gaps between the metal leads;
providing a printed LF portion, on at least a portion of the metal leads, including printed metal traces that connect to and extend inward from at least one of the metal leads over the dielectric support material; and
flip chip mounting an integrated circuit die on the printed LF portion.

15. The method of claim 14, wherein the printed metal comprises an ink comprising a material that is a solid or a precursor for a solid that forms a solid upon curing or sintering.

16. The method of claim 15, wherein the ink includes copper or silver nanoparticles.

17. The method of claim 14, wherein the printed metal has a porosity greater than, a mechanical strength less than, and an electrical conductivity less than the metal structures of the LFs.

18. The method of claim 14, further comprising molding the lead frame and IC die.

19. The method of claim 14, wherein the dielectric support material is provided by a top dielectric layer of a molded interconnect substrate (MIS).

20. The method of claim 14, wherein the metal leadframe is printed via inkjet printing using piezoelectric, thermal, acoustic, or electrostatic inkjet printing, screen printing, or flexographic printing.

21. The method of claim 14, wherein a surface of the LFs include nano-roughening.

22. The method of claim 14, wherein the metal leads comprise at least one floating lead, and wherein the printed LF portion contacts the floating lead.

23. The method of claim 14, wherein the printed metal has a porosity of greater than 10%.

24. The method of claim 14, wherein at least some of the metal leads have a first end extending away from a center of the lead frame and a second end extending toward the center of the lead frame and wherein each printed metal trace has a first end deposited on the second end of one of the metal leads.

25. The method of claim 24, wherein each printed metal trace extends from the second end of one of the metal leads and toward the center of the lead frame.

26. A semiconductor packaging method, comprising:
providing a metal leadframe (LF) including metal leads on at least 2 sides and a dielectric support material in gaps between the metal leads;
providing a printed LF portion including printed metal traces that connect to and extend inward from at least one of the metal leads over the dielectric support material that are coupled to flip chip (FC) pads configured for receiving bump features including at least some of the printed metal traces coupled to bond pads on an integrated circuit (IC) die to be mounted;
flip chip mounting the IC die on the printed LF portion so that the bump features are connected to the FC pads; and
determining a plurality of preliminary candidate LF designs which satisfy requirements for the IC die including a number of input or outputs (I/Os) and a location of the bump features, narrowing the preliminary candidate LFs in number to identify candidate LFs by simulating the preliminary candidate LFs to quantify their performance to create a set of candidate LF designs which satisfy requirements for the IC die, repeating the determining and narrowing for at least one other IC die that has some similarity in the number of I/Os and a package size, creating a set of candidate custom LF designs for different IC devices including the IC die and the other IC die which have a similar number of the I/Os and die size, and generating a custom LF design including the LF and printed LF portion based on common features between two or more of the candidate custom LF designs.

27. A semiconductor packaging method, comprising:
providing a metal leadframe (LF) including metal leads on at least 2 sides and a dielectric support material in gaps between the metal leads;
printing metal traces, on at least a portion of the metal leads, that connect to and extend inward from at least one of the metal leads over the dielectric support material; and
flip chip mounting an integrated circuit die on the printed metal traces.

28. The method of claim 27, wherein at least some of the metal leads have a first end extending away from a center of the lead frame and a second end extending toward the center of the lead frame and wherein each printed metal trace has a first end deposited on the second end of one of the metal leads.

29. The method of claim 28, wherein each printed metal trace extends from the second end of one of the metal leads and toward the center of the lead frame.

30. A semiconductor packaging method, comprising:
providing a metal leadframe (LF) including metal leads on at least 2 sides and a dielectric support material in gaps between the metal leads;
printing metal traces, on at least a portion of the metal leads, that connect to and extend inward from at least one of the metal leads over the dielectric support material and terminate in pads configured for receiving bump features on an integrated circuit (IC) die to be mounted; and
mounting the IC die on the printed metal traces so that the bump features are connected to the pads.

31. The method of claim 30, wherein at least some of the metal leads have a first end extending away from a center of the lead frame and a second end extending toward the center of the lead frame and wherein each printed metal trace has a first end deposited on the second end of one of the metal leads.

32. The method of claim 31, wherein each printed metal trace extends from the second end of one of the metal leads and toward the center of the lead frame.

* * * * *